United States Patent
Wan et al.

(10) Patent No.: US 12,272,755 B2
(45) Date of Patent: Apr. 8, 2025

(54) SEMICONDUCTOR STRUCTURE

(71) Applicant: MediaTek Inc., Hsin-Chu (TW)

(72) Inventors: Cheng-Tien Wan, Hsin-Chu (TW); Ming-Cheng Lee, Hsin-Chu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 18/420,327

(22) Filed: Jan. 23, 2024

(65) Prior Publication Data
US 2024/0170580 A1 May 23, 2024

Related U.S. Application Data

(63) Continuation of application No. 17/852,292, filed on Jun. 28, 2022, now Pat. No. 11,923,460, which is a
(Continued)

(51) Int. Cl.
*H01L 29/786* (2006.01)
*H01L 21/02* (2006.01)
(Continued)

(52) U.S. Cl.
CPC .. *H01L 29/78696* (2013.01); *H01L 21/02532* (2013.01); *H01L 21/02546* (2013.01);
(Continued)

(58) Field of Classification Search
CPC ......... H01L 29/78696; H01L 21/02532; H01L 21/02546; H01L 21/02549;
(Continued)

(56) References Cited

U.S. PATENT DOCUMENTS

| | | |
|---|---|---|
| 8,274,119 B2 | 9/2012 | Xiao |
| 9,425,293 B1 * | 8/2016 | Balakrishnan .... H01L 29/78696 |

(Continued)

FOREIGN PATENT DOCUMENTS

CN 101710584 A 5/2010

OTHER PUBLICATIONS

Chinese language office action dated May 31, 2024, issued in application No. CN 202011004332.9.
(Continued)

*Primary Examiner* — Tong-Ho Kim
(74) *Attorney, Agent, or Firm* — McClure, Qualey & Rodack, LLP

(57) ABSTRACT

A semiconductor structure includes several semiconductor stacks over a substrate, and each of the semiconductor stacks extends in a first direction, wherein adjacent semiconductor stacks are spaced apart from each other in a second direction, which is different from the first direction. Each of the semiconductor stacks includes channel layers above the substrate and a gate structure across the channel layers. The channel layers are spaced apart from each other in the third direction. The gate structure includes gate dielectric layers around the respective channel layers, and a gate electrode along sidewalls of the gate dielectric layers and a top surface of the uppermost gate dielectric layer. The space in the third direction between the two lowermost channel layers is greater than the space in the third direction between the two uppermost channel layers in the same semiconductor stack.

23 Claims, 12 Drawing Sheets

Related U.S. Application Data continuation of application No. 17/025,095, filed on Sep. 18, 2020, now Pat. No. 11,404,587.

(60) Provisional application No. 62/927,751, filed on Oct. 30, 2019.

(51) Int. Cl.

| | | |
|---|---|---|
| *H01L 21/28* | (2006.01) | |
| *H01L 29/06* | (2006.01) | |
| *H01L 29/423* | (2006.01) | |
| *H01L 29/49* | (2006.01) | |
| *H01L 29/66* | (2006.01) | |

(52) U.S. Cl.
CPC .. *H01L 21/02549* (2013.01); *H01L 21/02603* (2013.01); *H01L 21/28255* (2013.01); *H01L 21/28264* (2013.01); *H01L 29/0673* (2013.01); *H01L 29/42392* (2013.01); *H01L 29/4908* (2013.01); *H01L 29/66522* (2013.01); *H01L 29/66545* (2013.01); *H01L 29/66742* (2013.01); *H01L 29/78681* (2013.01); *H01L 29/78684* (2013.01)

(58) Field of Classification Search
CPC ......... H01L 21/02603; H01L 21/28255; H01L 21/28264; H01L 29/0673; H01L 29/42392; H01L 29/4908; H01L 29/66522; H01L 29/66545; H01L 29/66742; H01L 29/78681; H01L 29/78684; H01L 29/161; H01L 29/1054; H01L 29/66439; H01L 29/775; H01L 29/785; H01L 29/1033; H01L 29/42356; B82Y 10/00
USPC ........................................................ 257/347
See application file for complete search history.

(56) References Cited

U.S. PATENT DOCUMENTS

| | | | |
|---|---|---|---|
| 10,134,640 | B1 | 11/2018 | Chiang et al. |
| 11,404,587 | B2* | 8/2022 | Wan ................... H01L 21/02546 |
| 11,923,460 | B2* | 3/2024 | Wan ..................... H01L 29/0673 |
| 2013/0234215 | A1* | 9/2013 | Okano .............. H01L 29/42364 |
| | | | 257/288 |
| 2017/0018610 | A1 | 1/2017 | Suk |
| 2017/0148787 | A1* | 5/2017 | Obradovic .......... H01L 29/4966 |
| 2017/0200738 | A1 | 7/2017 | Kim et al. |
| 2020/0152737 | A1* | 5/2020 | Hashemi .......... H01L 29/66439 |
| 2021/0118883 | A1* | 4/2021 | Lim .................. H01L 29/42392 |
| 2021/0135016 | A1 | 5/2021 | Wan et al. |
| 2022/0336680 | A1 | 10/2022 | Wan et al. |

OTHER PUBLICATIONS

U.S. Appl. No. 17/852,292, filed Jun. 28, 2022, Wan et al.
EP 20200232.5, Mar. 25, 2021, Extended European Search Report.
Extended European Search Report for European Application No. 20200232.5 dated Mar. 25, 2021.

\* cited by examiner

SEMICONDUCTOR STRUCTURE

CROSS REFERENCE TO RELATED APPLICATIONS

This application is a Continuation of Ser. No. 17/852,292, filed on Jun. 28, 2022, which is a Continuation of application Ser. No. 17/025,095, filed on Sep. 18, 2020, which claims priority to U.S. Provisional Application No. 62/927,751 filed on Oct. 30, 2019. The entire contents of these applications are incorporated herein by reference in their entireties.

BACKGROUND OF THE INVENTION

Field of the Invention

The present invention relates to a semiconductor structure, and in particular to a semiconductor structure including nanosheet transistors, wherein the nanosheet transistors have better electrical performance.

Description of the Related Art

In recent years, advanced integrated circuit (IC) devices have been become increasingly multifunctional and have been scaled down in size. Although the scaling down process generally increases production efficiency and lowers associated costs, it has also increased the complexity of processing and manufacturing IC devices. For example, Fin Field-Effect Transistors (FinFETs) have been introduced to replace planar transistors. Among these FinFETs, the gate-all-around (GAA) structures such as nanosheet metal-oxide-semiconductor field-effect transistors (MOSFET) have been developed to possess excellent electrical characteristics, such as improved power performance and area scaling compared to the current FinFET technologies.

Although existing semiconductor structures including nanosheet transistors and methods for manufacturing the same have been adequate for their intended purposes, they have not been entirely satisfactory in all respects. For example, in a semiconductor structure including nanosheet transistors, each of the multilayered fins includes several channel layers stacked over the substrate and the channel layers in one of the multilayered fins are apart from each other in the direction vertical to the substrate. Those multilayered fins are relatively tall, and it is difficult to fill the empty space in the deeper position of the fins with the desired material(s), such as filling the empty space near the bottom of the multilayered fins with the material(s) of the gate electrode layer. The thicknesses of the gate electrode layers between the nanosheet transistors controlled by the same gate stack are not uniform. Thus, the threshold voltages between the nanosheet transistors controlled by the same gate stack would be different, which affects the electrical performance of the semiconductor structure during operation. Therefore, there are still some problems to be overcome in regards to semiconductor structures including nanosheet transistors in the semiconductor integrated circuits and technology.

BRIEF SUMMARY OF THE INVENTION

Some embodiments of the present disclosure provide semiconductor structures. An exemplary embodiment of a semiconductor structure includes several semiconductor stacks over a substrate. Each of the semiconductor stacks extends in the first direction. Adjacent semiconductor stacks are spaced apart from each other in the second direction. The second direction is different from the first direction. Each of the semiconductor stacks includes channel layers above the substrate and a gate structure across the channel layers. The channel layers are spaced apart from each other in the third direction. The third direction is vertical to the first direction and the second direction. The gate structure includes several gate dielectric layers around the respective channel layers. The gate structure also includes a gate electrode along the sidewalls of the gate dielectric layers and the top surface of the uppermost gate dielectric layer. In some embodiments, the space in the third direction between the two lowermost channel layers is greater than the space in the third direction between the two uppermost channel layers.

An exemplary embodiment of a semiconductor structure includes several semiconductor stacks over a substrate. Each of the semiconductor stacks extends in a first direction. Adjacent semiconductor stacks are spaced apart from each other in a second direction. The second direction is different from the first direction. Each of the semiconductor stacks includes channel layers above the substrate and a gate structure across the channel layers. The channel layers are spaced apart from each other in the third direction. The third direction is vertical to the first direction and the second direction. The gate structure includes gate dielectric layers around the respective channel layers. The gate structure also includes a gate electrode along the sidewalls of the gate dielectric layers and the top surface of the uppermost gate dielectric layer. In some embodiments, the lowermost channel layer in one of the semiconductor stacks includes a higher germanium content than the other channel layers in the same semiconductor stack.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 2A, FIG. 3A, FIG. 4A, FIG. 5A, FIG. 6A, FIG. 7A, FIG. 8A and FIG. 9A are cross-sectional views taken along sectional line A-A of the semiconductor structure in FIG. 1.

FIG. 2B, FIG. 3B, FIG. 4B, FIG. 5B, FIG. 6B, FIG. 7B, FIG. 8B and FIG. 9B are cross-sectional views taken along sectional line B-B of the semiconductor structure in FIG. 1.

DETAILED DESCRIPTION OF THE INVENTION

Figure 1:
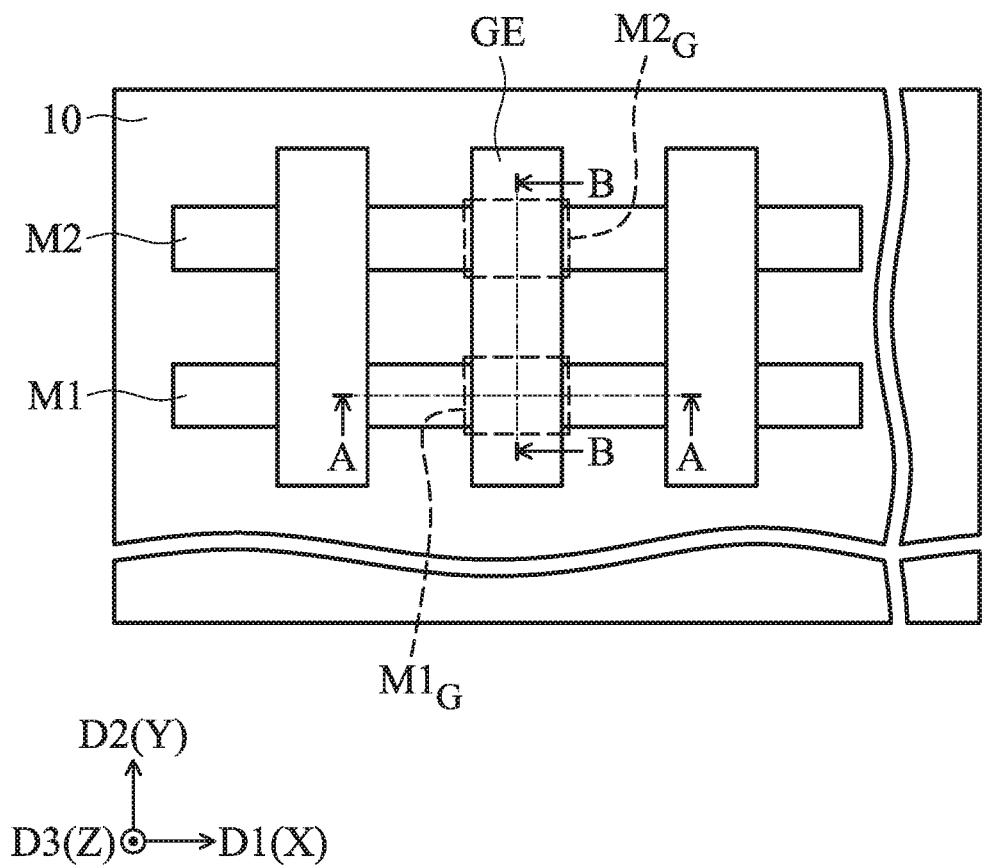
FIG. 1 is a top view of a semiconductor structure over a substrate.

The following description is of the best-contemplated mode of carrying out the invention. This description is made for the purpose of illustrating the general principles of the invention and should not be taken in a limiting sense. The scope of the invention is determined by reference to the appended claims.

The inventive concept is described fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. Also, the drawings as illustrated are only schematic and are non-limiting. In the drawings, the size of some of the elements may be exaggerated for illustrative purposes and not drawn to scale. The dimensions and the relative dimensions do not correspond to actual dimensions in the practice of the invention.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It should be understood that when an element is referred to as being "connected" or "contacting" to another element, it may be directly connected or contacting to the other element or intervening elements may be present.

Similarly, it should be understood that when an element such as a layer, region or substrate is referred to as being "on" another element, it can be directly on the other element or intervening elements may be present. In contrast, the term "directly" means that there are no intervening elements. It should be understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Furthermore, spatially relative terms, such as "beneath," "below," "lower," "above," "upper" and the like, may be used herein for ease of description to describe one element or feature's relationship to another element(s) or feature(s) as illustrated in figures. The spatially relative terms are intended to encompass different orientations of the device in use or operation in addition to the orientation depicted in the figures. It should be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same or similar reference numerals or reference designators denote the same or similar elements throughout the specification.

FIG. 1 is a top view of a semiconductor structure over a substrate. In some embodiments, the semiconductor structure is a three-dimensional or non-planar transistor. In some embodiments, the semiconductor structure is a field-effect transistor (FET) structure including nanosheet transistors.

Referring to FIG. 1, a semiconductor structure 1 includes several multilayered fins M1 and M2 over a substrate 10, and a gate structure GE across the multilayered fins M1 and M2 to form semiconductor stacks $M1_G$ and $M2_G$. To simplify the diagram, only two multilayered fins M1 and M2 are depicted herein. The multilayered fins M1 and M2 may extend in the first direction D1 (such as X-direction), and the gate structure GE may extend in the second direction D2. In some embodiments, the semiconductor stacks $M1_G$ and $M2_G$ are nanosheet stacks, and each of the semiconductor stacks includes nanosheet transistors. As shown in FIG. 1, adjacent multilayered fins M1 and M2 (or adjacent semiconductor stacks $M1_G$ and $M2_G$) are spaced apart from each other in the second direction D2 (such as Y-direction), wherein the second direction D2 is different from the first direction D1. For example, the second direction D2 is perpendicular to the first direction D1.

According to some embodiments of the present disclosure, each of the semiconductor stacks (such as $M1_G$ and $M2_G$) in a semiconductor structure includes nanosheet transistors, and the channel layers of each of the semiconductor stacks are designed to improve the electrical performances. Examples of the designs include altering the spaces between adjacent channel layers in each of the semiconductor stacks, changing compositions of the channel layers in each of the semiconductor stacks, or a combination of the aforementioned changes. Therefore, improved electrical performances including uniform threshold voltages of the nanosheet transistors in each of the semiconductor stacks can be obtained.

A method for forming a semiconductor structure having semiconductor stacks is described below, wherein the spaces between adjacent channel layers in each of the semiconductor stacks are designed to improve the electrical performances of the nanosheet transistors. However, the present disclosure is not limited to the method provided herein. Those steps provided herein are merely described as one example of the fabrication.

FIG. 2A, FIG. 2B, FIG. 3A, FIG. 3B, FIG. 4A, FIG. 4B, FIG. 5A, FIG. 5B, FIG. 6A, FIG. 6B, FIG. 7A, FIG. 7B, FIG. 8A, FIG. 8B, FIG. 9A, FIG. 9B are cross-sectional views of intermediate stages of a method for forming a semiconductor structure, in accordance with some embodiments. FIG. 2A, FIG. 3A, FIG. 4A, FIG. 5A, FIG. 6A, FIG. 7A, FIG. 8A and FIG. 9A are cross-sectional views taken along sectional line A-A of the semiconductor structure in FIG. 1. FIG. 2B, FIG. 3B, FIG. 4B, FIG. 5B, FIG. 6B, FIG. 7B, FIG. 8B and FIG. 9B are cross-sectional views taken along sectional line B-B of the semiconductor structure in FIG. 1.

Figure 2A:
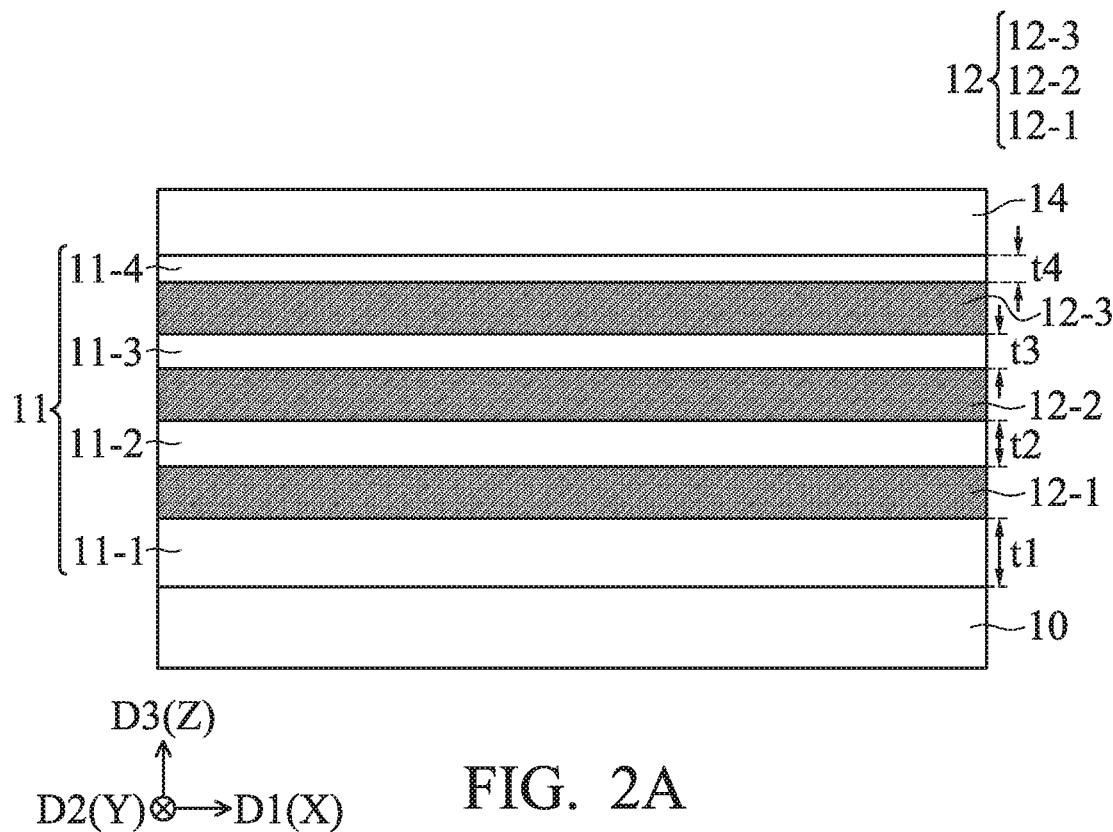
FIG. 2A, FIG. 2B, FIG. 3A, FIG. 3B, FIG. 4A, FIG. 4B, FIG. 5A, FIG. 5B, FIG. 6A, FIG. 6B, FIG. 7A, FIG. 7B, FIG. 8A, FIG. 8B, FIG. 9A, FIG. 9B are cross-sectional views of intermediate stages of a method for forming a semiconductor structure in accordance with some embodiments.
Figure 2B:
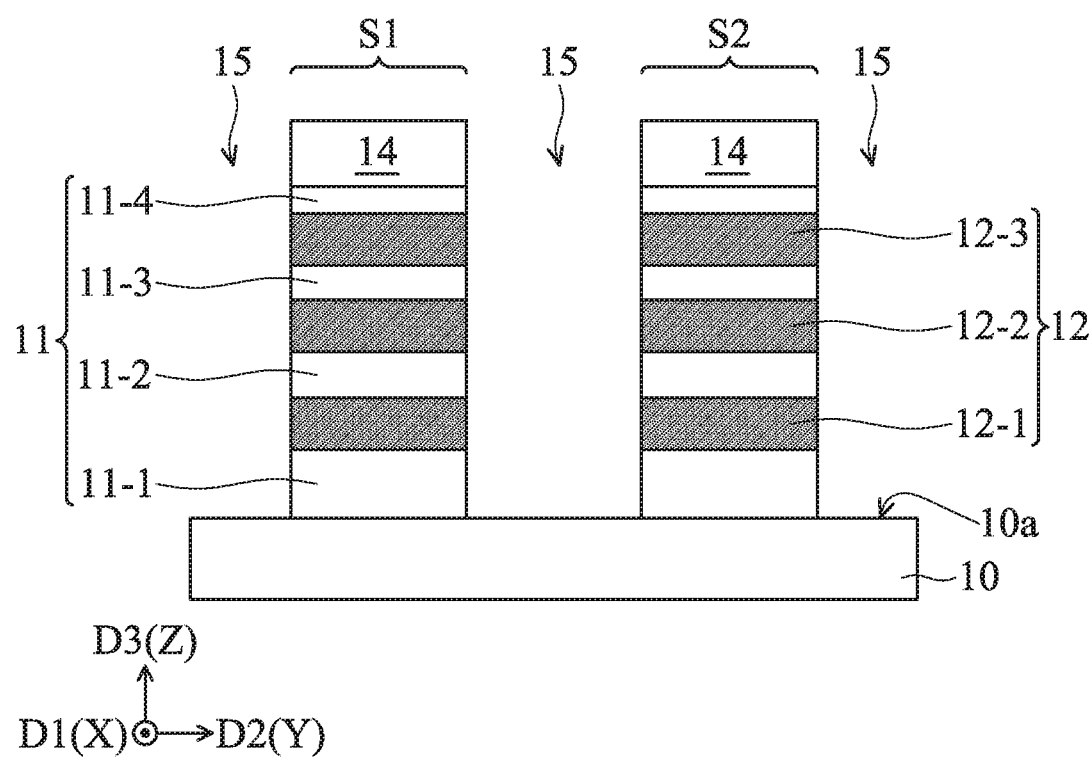

Referring to FIG. 2A and FIG. 2B, a substrate 10 is provided, and several semiconductor strips S1 and S2 are formed over the substrate 10, wherein the adjacent semiconductor strips S1 and S2 are spaced apart from each other in the second direction D2 (such as Y-direction). In some embodiments, each of the semiconductor strips S1 and S2 may include several sacrificial layers 11 and several channel layers 12 on the substrate 10. According to some embodiments of the present disclosure, the space in the third direction D3 (such as Z-direction) between the two lowermost channel layers is greater than the space between the two uppermost channel layers.

In some embodiments, the substrate 10 is a bulk semiconductor substrate, such as a semiconductor wafer. For example, the substrate 10 includes silicon or other elementary semiconductor materials such as germanium. The substrate 100 may be un-doped or doped (e.g., p-type, n-type, or a combination thereof). In some embodiments, the substrate 10 includes an epitaxially grown semiconductor layer on a dielectric layer. The epitaxially grown semiconductor layer may be made of silicon germanium, silicon, germanium, one or more other suitable materials, or a combination thereof. In some other embodiments, the substrate 10 includes a multi-layered structure. For example, the substrate 10 includes a silicon-germanium layer formed on a bulk silicon layer.

The semiconductor strips S1 and S2 may be formed/patterned by any suitable method. The steps below are provided for describing one applicable method for forming the semiconductor strips S1 and S2. In some embodiments, several sacrificial layers 11 and several channel layers 12 are alternately deposited over the substrate 10, followed by depositing a patterned hardmask layer 14 on the uppermost sacrificial layer. Then, the sacrificial layers 11 and the channel layers 12 are patterned using the patterned hardmask layer 14, thereby forming the semiconductor strips S1 and S2 on the substrate 10. The patterned hardmask layer 14 may be a silicon nitride layer or a patterned layer formed by one or more other suitable materials. The semiconductor strips S1 and S2 are separated by the first trench 15. In some embodiments, the semiconductor strips S1 and S2 extend in the first direction D1 (such as X-direction), as shown in FIG. 2A. Also, the semiconductor strips S1 and S2 are arranged along the second direction D2 (such as Y-direction), as shown in FIG. 2B. That is, the semiconductor strips S1 and S2 are spaced apart from each other in the second direction D2.

To simplify the diagram, three channel layers 12 (such as the first channel layer 12-1, the second channel layer 12-2 and the third channel layer 12-3) and four sacrificial layers 11 (such as the first sacrificial layer 11-1, the second sacrificial layer 11-2, the third sacrificial layer 11-3 and the fourth sacrificial layer 11-4) are depicted herein for illustrating the material layers of each of the semiconductor strips S1 and S2. Also, although two semiconductor strips S1 and S2 are depicted herein to simplify the diagram of the embodiment, more semiconductor strips may be formed on the substrate 10, and adjacent two semiconductor strips are separated by the first trench 15.

Also, as shown in FIG. 2B, in each of the semiconductor strips S1 and S2, the channel layers 12 (such as the first channel layer 12-1, the second channel layer 12-2 and the third channel layer 12-3) above the substrate 10 are spaced apart from each other in the third direction D3 (such as Z-direction). The third direction D3 is vertical to the first direction D1 and the second direction D2. In some embodiments of the present disclosure, the space between the first channel layer 12-1 and the second channel layer 12-2 is greater than the space between the second channel layer 12-2 and the third channel layer 12-3.

Specifically, as shown in FIG. 2B, the first sacrificial layer 11-1, the second sacrificial layer 11-2, the third sacrificial layer 11-3 and the fourth sacrificial layer 11-4 have the thicknesses t1, t2, t3 and t4, respectively. A distance in the third direction D3 between the first channel layer 12-1 and the second channel layer 12-2 (e.g. the two lowermost channel layers in this example) is defined as the first space, and the first space is identical to the thickness t2 of the second sacrificial layer 11-2. A distance in the third direction D3 between the second channel layer 12-2 and the third channel layer 12-3 (e.g. the two uppermost channel layers in this example) is defined as the second space, and the second space is identical to the thickness t3 of the third sacrificial layer 11-3. According to some embodiments of the present disclosure, the first space (e.g. equal to the thickness t2) is greater than the second space (e.g. equal to the thickness t3) (t2>t3). In addition, the thickness t1 of the first sacrificial layer 11-1 may be equal to or greater than the thickness t2 of the second sacrificial layer 11-2, and the thickness t4 of the fourth sacrificial layer 11-4 may be equal to or greater than the thickness t3 of the third sacrificial layer 11-3.

In some embodiments, the channel layers 12 include one or more elements selected from group IV semiconductor materials, such as Si (intrinsic Si or lightly doped Si), Ge (intrinsic Ge or lightly doped Ge), SiGe, or a compound including Sn or Pb. In some embodiments, the channel layers 12 include a compound formed by elements selected from group III-V semiconductor materials, such as GaAs, InAs or InSb. It should be noted that the channel layer 12 of the present disclosure is not limited to include the aforementioned materials.

In addition, the channel layers 12 in one of the semiconductor strips are made of the same material or the same compound with the same molar ratio of two or more elements. In some embodiments, the channel layers 12 in one semiconductor strip are made of silicon (Si). In some other embodiments, the channel layers 12 in one semiconductor strip are made of silicon germanium, wherein the molar ratios of silicon and germanium in each of the channel layers 12 are identical. For example, the channel layers 12 in one semiconductor strip are respectively formed by $Si_{(1-x)}Ge_x$, $Si_{(1-y)}Ge_y$, $Si_{(1-z)}Ge_z$, wherein x=y=z. Also, the sacrificial layers 11 can be formed by a material different from the material of the channel layers 12, and will be removed in the later process. In this embodiment, the channel layers 12 are made of silicon (Si), and the sacrificial layers 11 are made of silicon germanium (SiGe).

Figure 3A:
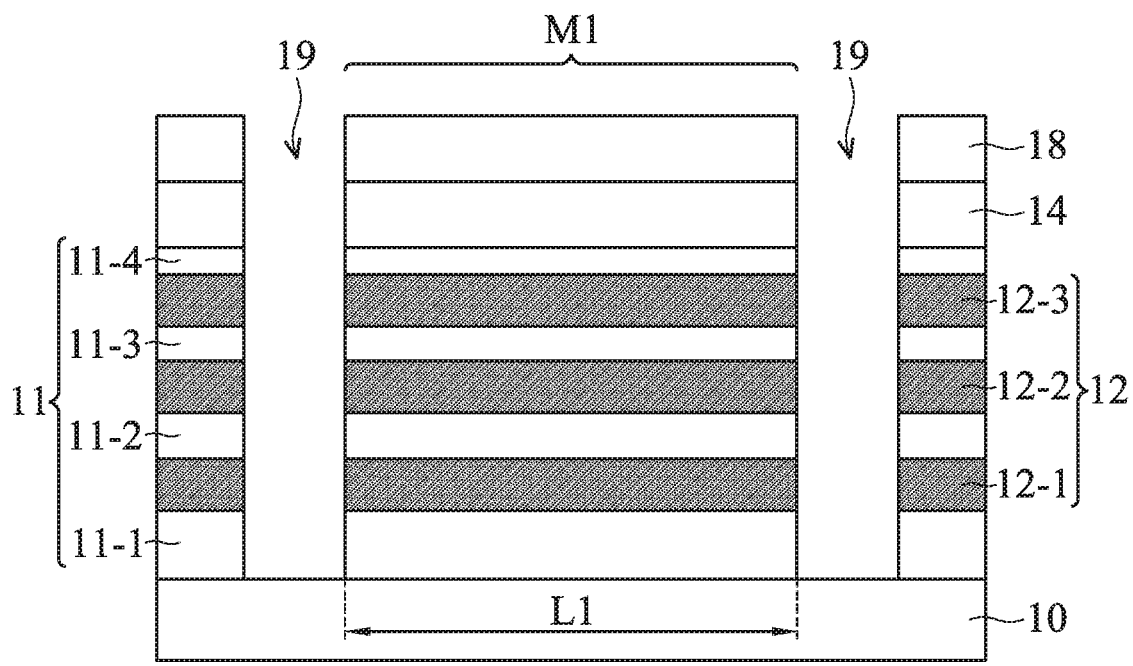
Figure 3B:
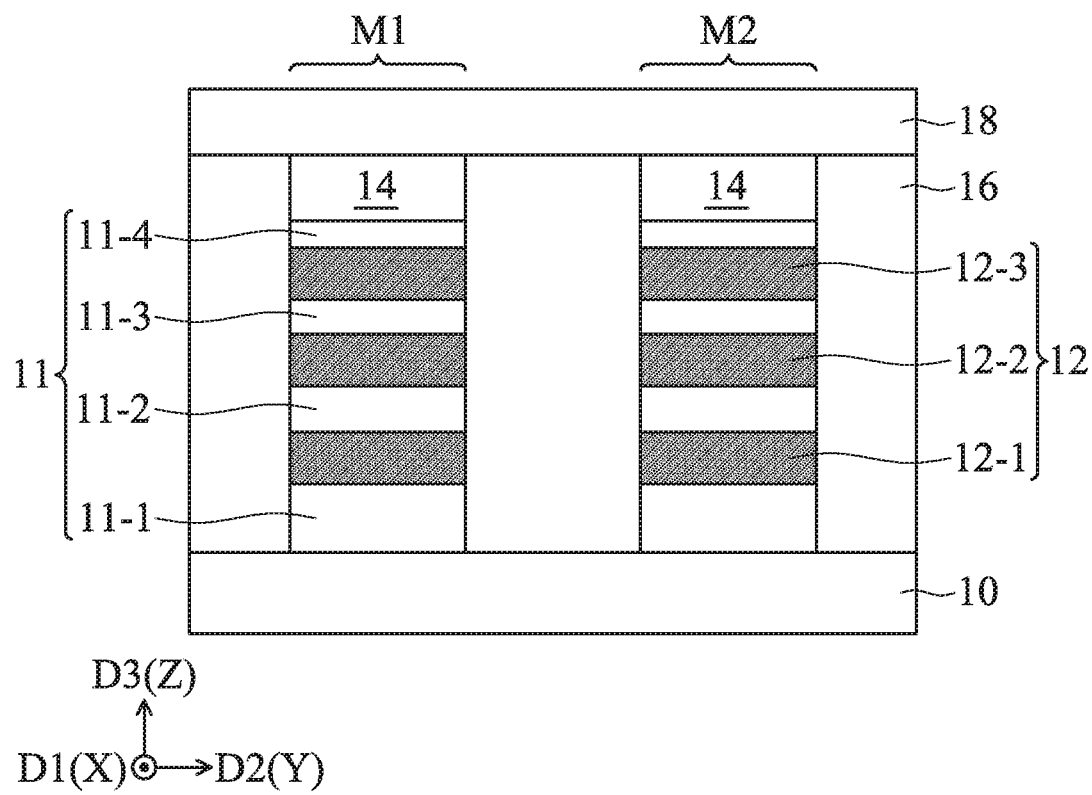

Next, referring to FIG. 3A and FIG. 3B, in some embodiments, an insulating layer 16 is deposited over the semiconductor strips S1 and S2 and fills the first trench 15 between the semiconductor strips S1 and S2. A planarization process, such as a chemical mechanical polishing (CMP) process, is performed to remove the excess portion of the insulating layer 16 above the patterned hardmask layer 14. Then, a patterned mask 18 can be formed on the patterned hardmask layer 14 and the insulating layer 16. The semiconductor strips S1 and S2 can be (optionally) patterned to form the second trenches 19, thereby defining several multilayered fins covered by the patterned mask 18. Numbers of the multilayered fins depend on the design requirements in applications. As shown in FIG. 3A, two second trenches 19 extending in the second direction D2 define three multilayered fins, and one multilayered fin M1 with a full width in the first direction D1 is illustrated to simplify the diagram of the embodiment. As shown in FIG. 3B, the patterned mask 18 is formed on the multilayered fins M1 and M2, wherein the multilayered fins M1 and M2 are spaced apart from each other in the second direction D2 (such as Y-direction).

In some embodiments, the patterned mask 18 may include an organic planarizing layer, an anti-reflective coating (ARC) film, a photoresist layer, or other suitable materials.

The patterned mask 18 can be applied in different layout configurations to define the number and the lengths of multilayered fins M1 and M2. The length L1 of the multilayered fin M1 in the first direction D1 is shown in FIG. 3A.

To form nanosheet transistors of the semiconductor structure in accordance with some embodiments of the present disclosure, the sacrificial layers 11 in the multilayered fins have to be removed, followed by forming a gate structure across selected multilayered fins and wrapping around the channel layers of the selected multilayered fins.

One of the applicable processes (i.e. FIG. 4A, FIG. 4B, FIG. 5A, FIG. 5B, FIG. 6A and FIG. 6B) is provided below for exemplifying the removal of the sacrificial layers 11 in the multilayered fins.

Figure 4A:
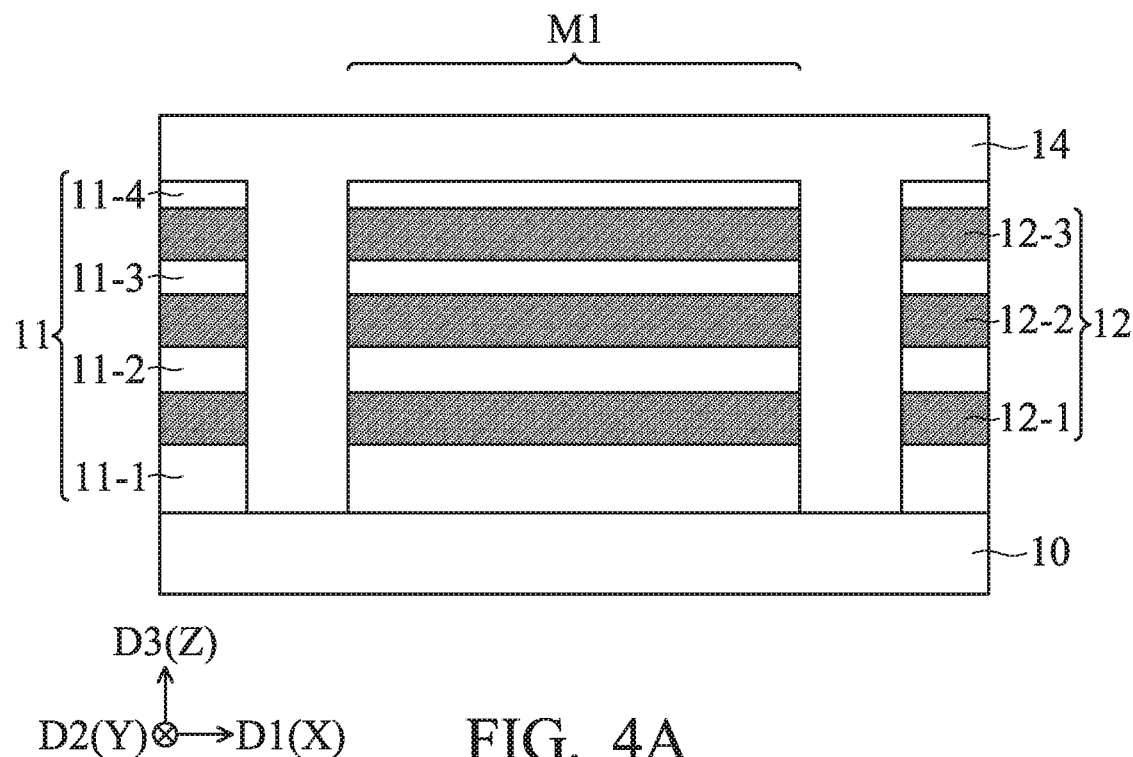
Figure 4B:
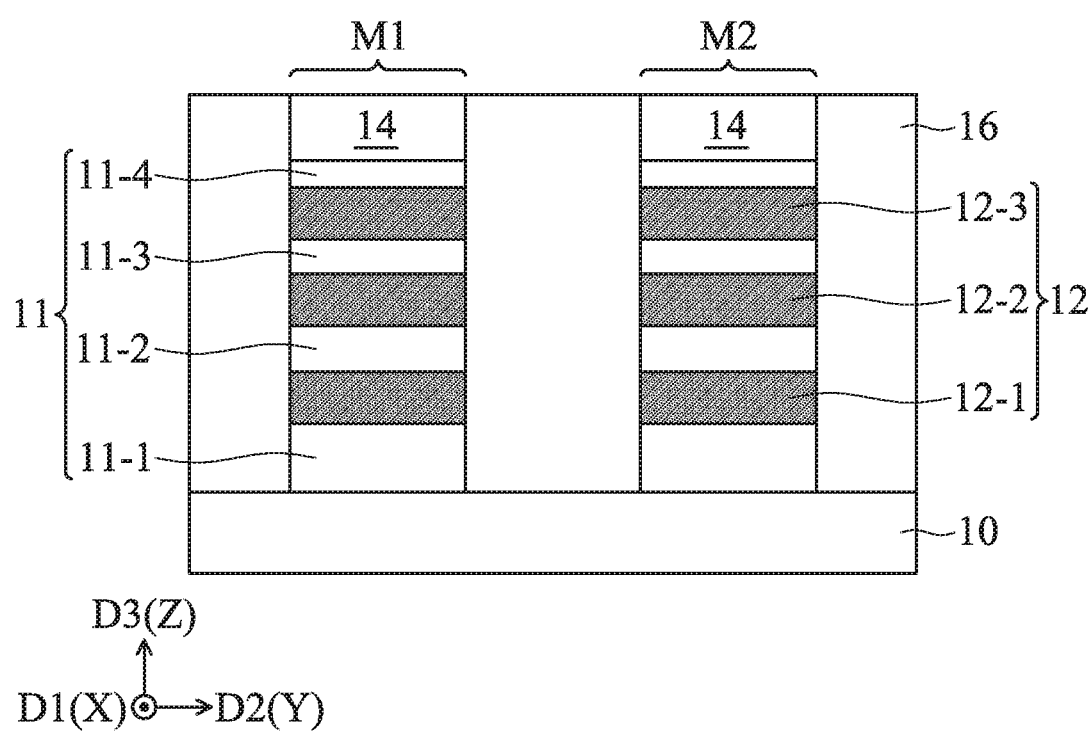

Referring to FIG. 4A and FIG. 4B, in some embodiments, the patterned mask 18 is removed, and the material of the patterned hardmask layer 14 is deposited on the multilayered fins M1 and M2 and fills the second trenches 19. A planarization process, such as a chemical mechanical polishing (CMP) process, can be performed to remove the excess portion of the insulating layer 16 above the insulating layer 16, thereby exposing the insulating layer 16. As shown in FIG. 4A, the material of the patterned hardmask layer 14 fills the second trenches 19 between the multilayered fins arranged separately in the first direction D1. Also, as shown in FIG. 4B, the insulating layer 16 filling the first trenches 15 is exposed between the multilayered fins M1 and M2 arranged separately in the second direction D2.

Figure 5A:
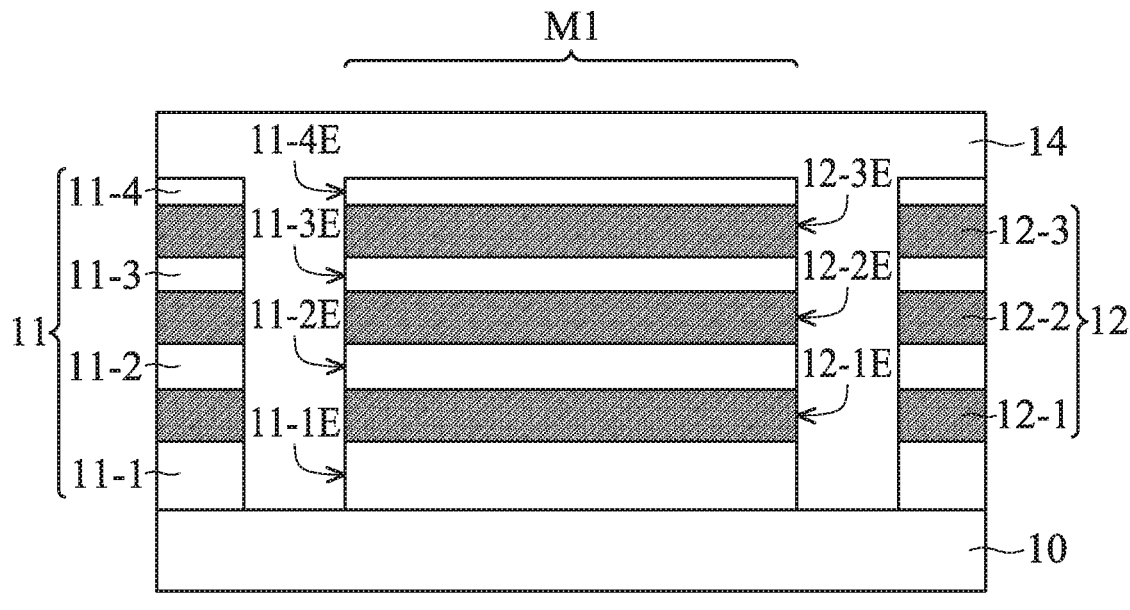
Figure 5B:
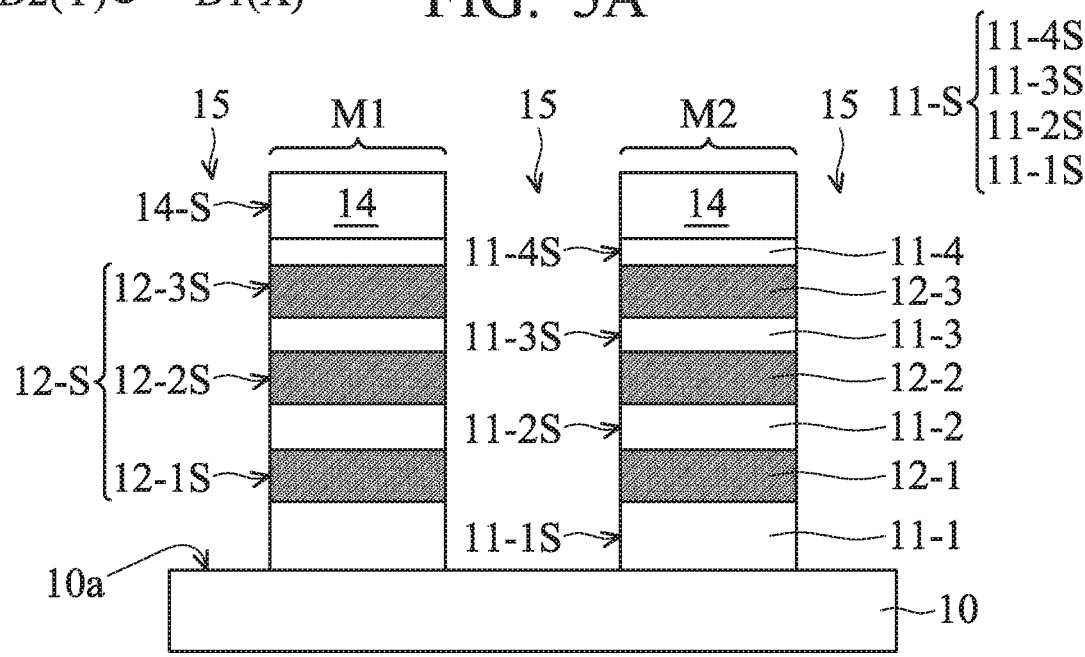

Next, referring to FIG. 5A and FIG. 5B, in some embodiments, the insulating layer 16 is removed from the first trenches 15. After removing the insulating layer 16, two opposite sidewalls of the sacrificial layers 11 and the channel layers 12 of the multilayered fins M1 and M2 are exposed in the first trenches 15 (FIG. 5B), and the other two opposite sidewalls of the sacrificial layers 11 and the channel layers 12 of the multilayered fins M1 and M2 are covered by the material of the patterned hardmask layer 14 filling in the second trenches 19.

Specifically, in the multilayered fins M1 and M2 as shown in FIG. 5B, the sidewalls 11-1S of the first sacrificial layer 11-1, the sidewalls 12-1S of the first channel layer 12-1, the sidewalls 11-2S of the second sacrificial layer 11-2, the sidewalls 12-2S of the second channel layer 12-2, the sidewalls 11-3S of the third sacrificial layer 11-3, the sidewalls 12-3S of the third channel layer 12-3, the sidewalls 11-4S of the fourth sacrificial layer 11-4 and the sidewalls 14-S of the patterned hardmask layer 14 are revealed by the first trenches 15. Also, take the multilayered fin M1 as an example, the sidewalls 11-1E of the first sacrificial layer 11-1, the sidewalls 12-1E of the first channel layer 12-1, the sidewalls 11-2E of the second sacrificial layer 11-2, the sidewalls 12-2E of the second channel layer 12-2, the sidewalls 11-3E of the third sacrificial layer 11-3, the sidewalls 12-3E of the third channel layer 12-3 and the sidewalls 11-4E of the fourth sacrificial layer 11-4 are covered by the material of the patterned hardmask layer 14 filling in the second trenches 19, as shown in FIG. 5A. That is, two opposite sidewalls (e.g. the sidewalls 12-1E, 12-2E and 12-3E) of the channel layers 12 of the multilayered fins M1 and M2 are secured (or anchored) by the material of the patterned hardmask layer 14 in the second trenches 19.

Figure 6A:
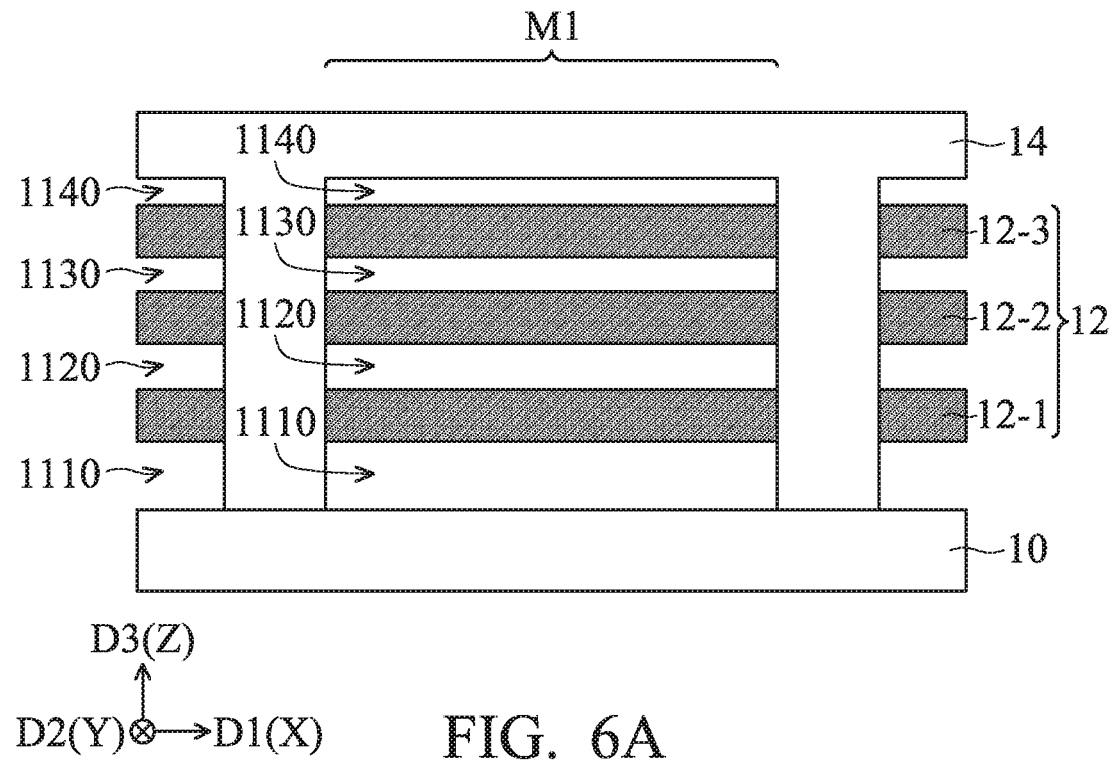
Figure 6B:
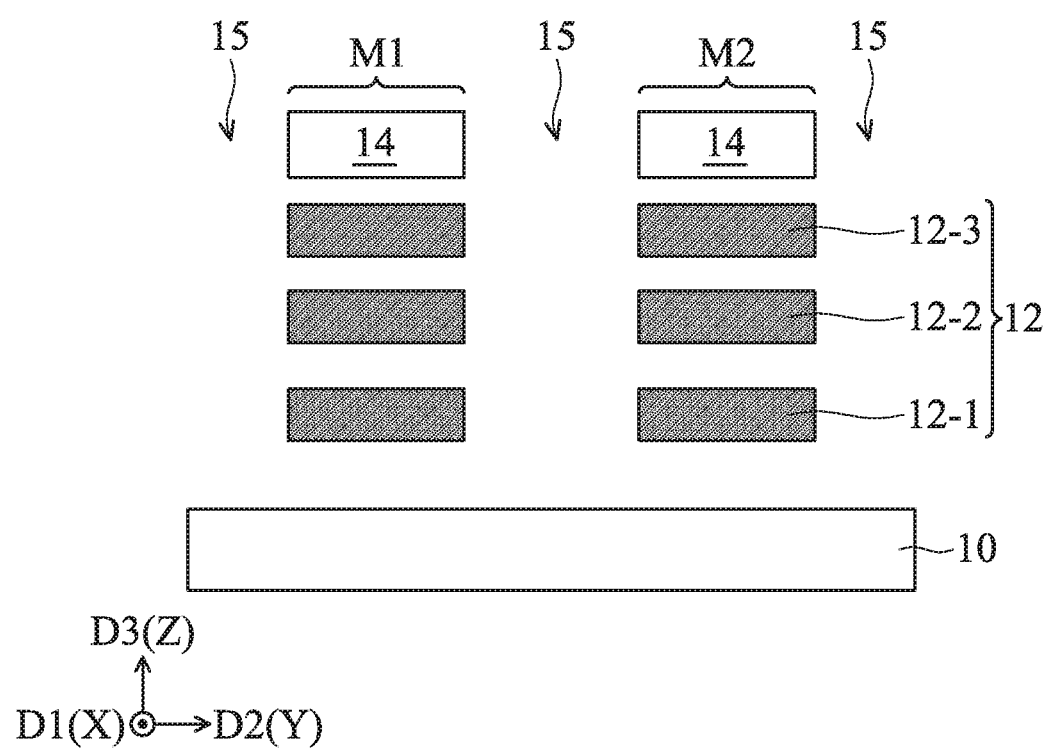

Next, referring to FIG. 6A and FIG. 6B, in some embodiments, the sacrificial layers 11 (including the first sacrificial layer 11-1, the second sacrificial layer 11-2, the third sacrificial layer 11-3 and the fourth sacrificial layer 11-4) are removed from the multilayered fins M1 and M2, thereby forming the empty spaces 1110, 1120, 1130 and 1140 (as shown in FIG. 6A). The sacrificial layers 11 can be removed using an isotropic dry or wet etching process that is selective to the channel layers 12. In FIG. 6B, the channel layers 12 in the multilayered fins M1 and M2 appear to be floating. However, the material of the patterned hardmask layer 14 in the second trenches 19 secure two ends of the channel layers 12. As clearly shown in FIG. 6A, two opposite sidewalls (e.g. the sidewalls 12-1E, 12-2E and 12-3E) of the channel layers 12 of the multilayered fins M1 and M2 are fixed to the material of the patterned hardmask layer 14 in the second trenches 19.

After the sacrificial layers 11 (such as the SiGe layers) have been removed, formation of a gate structure that is across selected multilayered fins and surrounds the channel layers of the selected multilayered fins is performed. One of the applicable processes (such as steps in FIG. 7A, FIG. 7B, FIG. 8A, FIG. 8B, FIG. 9A and FIG. 9B) is provided below for exemplifying the formation of a gate structure in the multilayered fins.

Figure 7A:
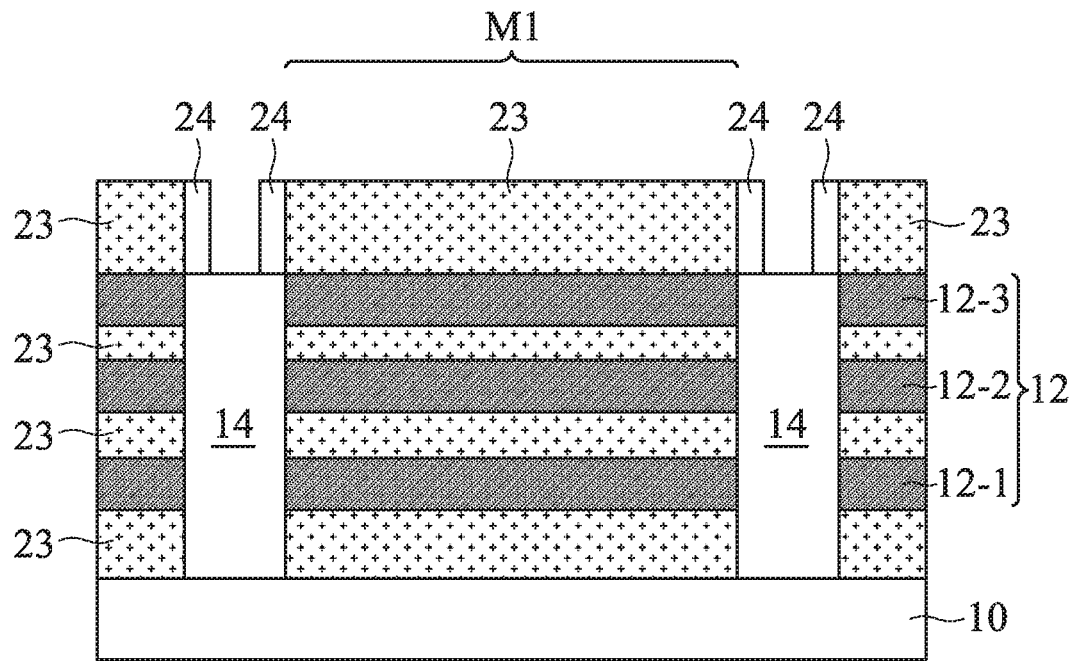
Figure 7B:
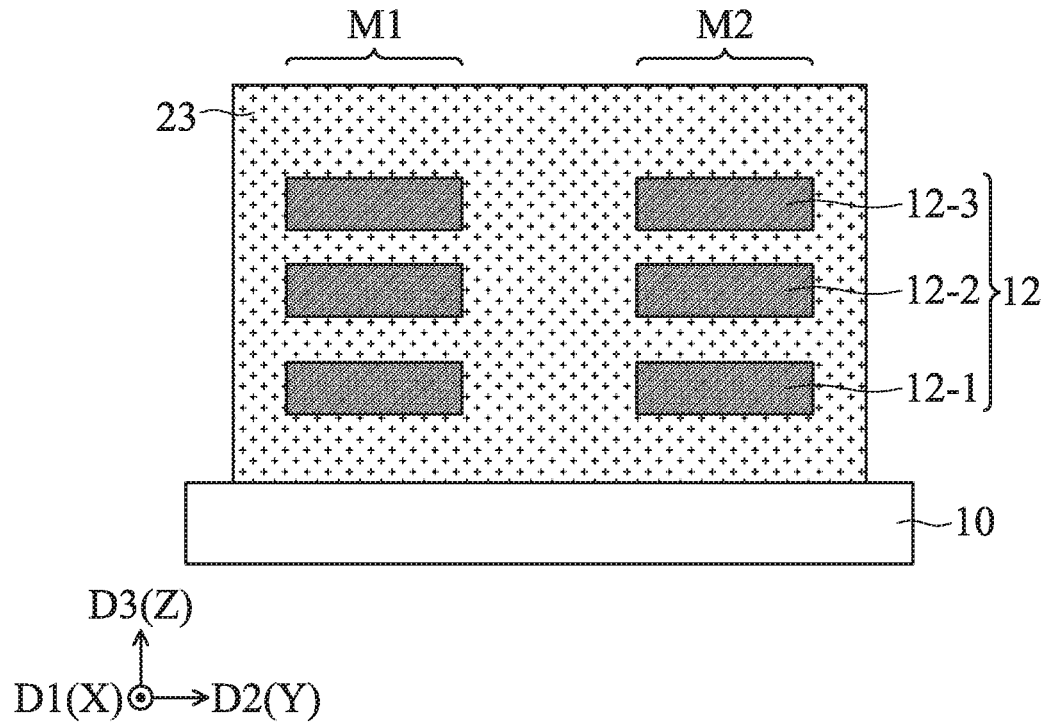

Referring to FIG. 7A and FIG. 7B, according to some embodiments, the portions of the patterned hardmask layer 14 above the third channel layer 12-3 (including the patterned hardmask layer 14 and a portion of the material of the patterned hardmask layer 14 in the second trenches 19) are removed. Then, a dummy gate stack 23 is formed across selected multilayered fins, and then spacers 24 are formed on the sidewalls of the dummy gate stack 23, thereby defining a region for forming nanosheet stacks. In some embodiments, the dummy gate stack 23 may include silicon (such as polysilicon) or other suitable materials. The dummy gate stack 23 can be a single layer or a multi-layered structure. The spacers 24 may include a low-k dielectric material, such as silicon boron carbon nitride (SiBCN), silicon oxycarbonitride (SiOCN), or silicon oxynitride (SiON). The spacers 24 can be a single layer or a multi-layered structure.

Also, in this embodiment, three regions for forming nanosheet stacks arranged in the first direction D1 are shown for exemplification, as shown in FIG. 7A. Also, each dummy gate stack 23 extending in the second direction D2 and across two multilayered fins M1 and M2 are shown for exemplification, as shown in FIG. 7B. However, those regions for forming nanosheet stacks and the two multilayered fins crossed by the dummy gate stack 23 in FIG. 7A and FIG. 7B are merely illustrated for exemplification. It should be noted that the present disclosure is not limited to the intermediate structure in FIG. 7A and FIG. 7B.

Figure 8A:
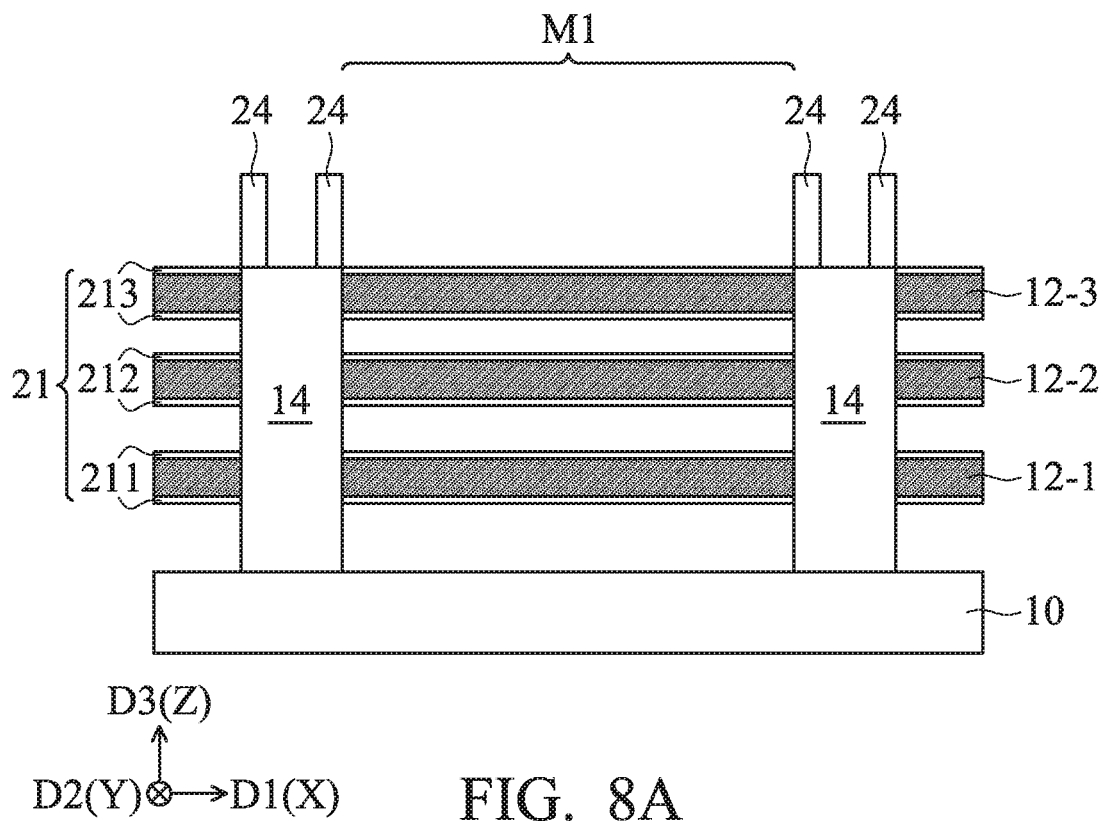
Figure 8B:
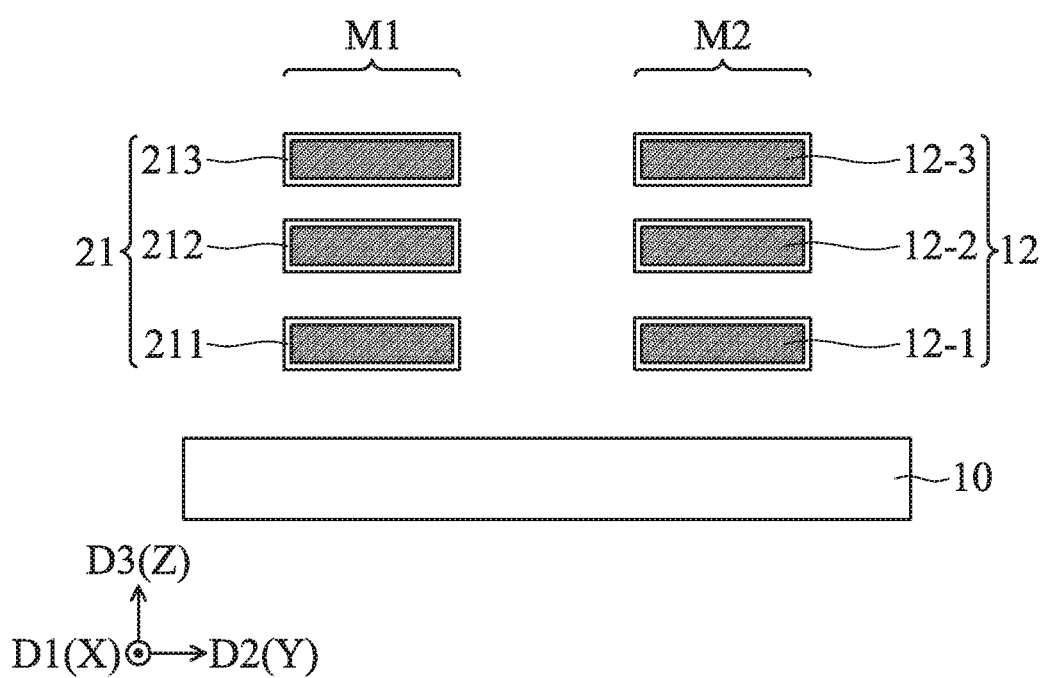

Next, referring to FIG. 8A and FIG. 8B, the dummy gate stacks 23 are removed. The remained spacers 24 define the regions for forming gate structure surrounding the channel layers 12. In some embodiments, each of the gate structures includes a gate dielectric layer 21 and a gate electrode GE. After the dummy gate stacks 23 are removed, the gate dielectric layers 21 are formed for surrounding the respective channel layers 12. Specifically, as shown in FIG. 8A and FIG. 8B, the gate dielectric layers 211, 212 and 213 are formed on two opposite sidewalls, the top surfaces and the bottom surfaces of the channel layers 12-1, 12-2 and 12-3, respectively. Also, in some embodiments, the gate dielectric layer 21 includes one or more high-k dielectric materials, such as the dielectric materials with a dielectric constant (k) greater than that of silicon dioxide, wherein the dielectric constant of silicon dioxide is about 3.7 to 3.9.

Figure 9A:
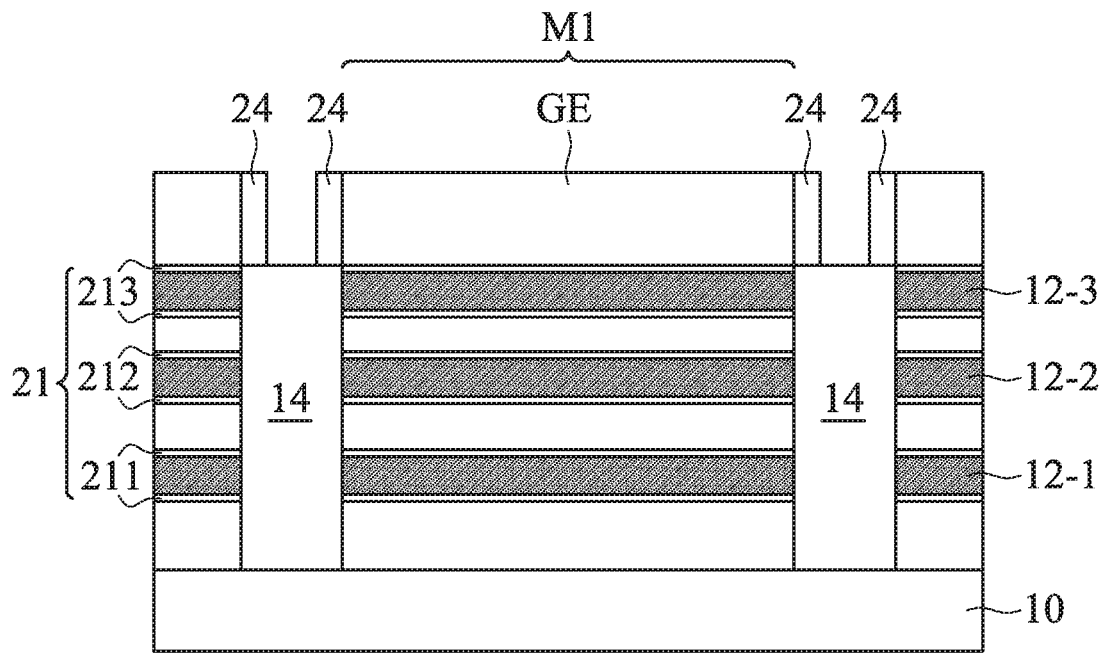
Figure 9B:
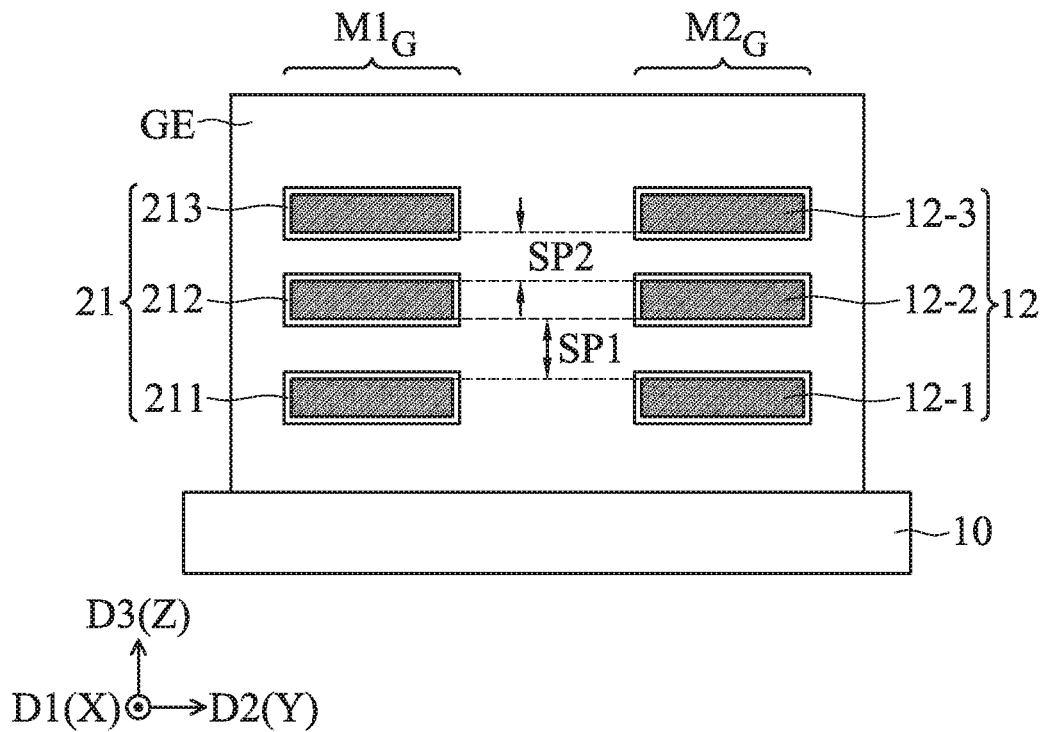

Next, referring to FIG. 9A and FIG. 9B, the gate electrodes GE fill the regions defined by the spacers 24. Each of the gate electrodes GE is formed at least on the sidewalls of the gate dielectric layers 21 and the top surfaces of the uppermost gate dielectric layers 213 of the gate dielectric layers 21. After the gate electrodes GE are formed, the multilayered fins M1 and M2 and the portions of the gate electrodes GE over the multilayered fins M1 and M2 can be referred as semiconductor stacks $M1_G$ and $M2_G$ in the description below. Also, after the gate electrodes GE are formed, the spacers 24 can be removed.

In some embodiments, as shown in FIG. 9A and FIG. 9B, the gate electrode GE fully fills the empty spaces between the gate dielectric layers 21 and the empty space between the lowermost channel layer 12-1 and the substrate 10 within the defined region. However, the present disclosure is not limited to the intermediate structure herein. In some other embodiments, the gate electrode GE may not fully fill the empty space around the lowermost channel layer 12-1.

According to the embodiments of the present disclosure, each of the gate structures may include a gate dielectric layer 21 and a gate electrode GE. In some embodiments as described above, the gate electrode GE of the gate structures may not include a work function tuning layer. However, in some other embodiments, the gate electrode GE may include work function tuning layers 26 and a metal filling layer 27.

Figure 10:
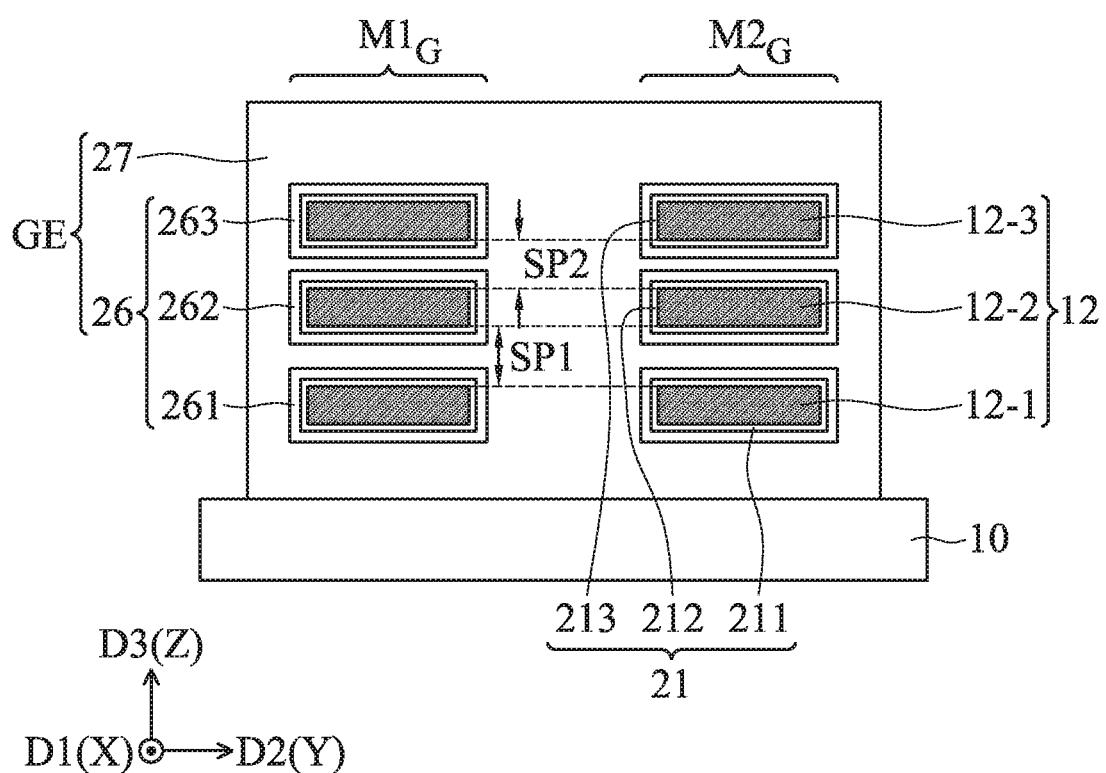
FIG. 10 is a cross-sectional view of a semiconductor structure in accordance with some embodiments.

FIG. 10 is a cross-sectional view of a semiconductor structure in accordance with some embodiments, which depicts the work function tuning layers 26 surrounding the gate dielectric layers 21, and a metal filling layer 27 around the work function tuning layers 26. In some embodiments, the gate dielectric layers 21 may electrically insulate the channel layers 12 from the gate electrode GE, wherein the gate electrode GE may include the metal filling layer 27, or a combination of the work function tuning metal layer 26 and the metal filling layer 27.

The work function tuning layer 26 of the gate electrode GE may be used to provide the desired work function for nanosheet transistors to enhance electrical performance including improved threshold voltage. In some embodiments, the work function tuning layer 26 includes titanium nitride, tantalum, tantalum nitride, one or more other suitable materials, or a combination thereof. Also, in some other embodiments, the work function tuning layer 26 is an aluminum-containing layer. For example, the aluminum-containing layer includes TiAlC, TiAlO, TiAlN, one or more other suitable materials, or a combination thereof. In addition, in some embodiments, the work function tuning layer 26 may include metal, metal carbide, metal nitride, other suitable materials, or a combination thereof. For example, the work function tuning layer 26 includes tantalum nitride, tungsten nitride, titanium, titanium nitride, other suitable materials, or a combination thereof. The work function tuning layer 26 may be deposited using an atomic layer deposition (ALD) process, a chemical vapor deposition (CVD) process, a physical vapor deposition (PVD) process, an electroplating process, an electroless plating process, one or more other applicable processes, or a combination thereof.

In some embodiments, the metal filling layer 27 may fill the spaces between adjacent work function tuning layers 261, 262 and 263, as shown in FIG. 9A, FIG. 9B and FIG. 10. However, the present disclosure is not limited to those configurations of the metal filling layer 27. In some other embodiments, the spaces between the work function tuning layers around the upper channel layers (e.g. the two uppermost channel layers) in one of the semiconductor stacks (such as $M1_G$ and $M2_G$) are fully filled with the metal filling layer 27, but the spaces between the work function tuning layers around the lower channel layers in the semiconductor stacks (such as $M1_G$ and $M2_G$) may not be fully filled with the metal filling layer 27 (not shown in the drawings). The electrical performances of the nanosheet transistors in a semiconductor stack (such as $M1_G$ or $M2_G$) can be improved (e.g. uniform threshold voltages of the nanosheet transistors) as long as the thicknesses of the work function tuning layers and the metal filling layer surrounding the lower channel layers (such as the lowermost channel layer) approximate to that surrounding the other channel layers.

In addition, in some embodiments, the metal filling layer 27 may be made of or includes tungsten, aluminum, copper, cobalt, one or more other suitable materials, or a combination thereof. The metal filling layer 27 may be deposited using an ALD process, a PVD process, a CVD process, an electroplating process, an electroless plating process, one or more other applicable processes, or a combination thereof.

After the structures as shown in FIG. 9A, FIG. 9B and FIG. 10 are formed, the subsequent processes are performed to complete a FET structure including nanosheet transistors. For example, the source/drain features (not shown) are formed to contact the channel layers 12 of the semiconductor stacks $M1_G$ and $M2_G$, followed by forming source/drain contacts and gate contacts, in accordance with some embodiments of the present disclosure. Details of the subsequent processes for forming the FET structure including nanosheet transistors are not described herein.

In the current fabrication process for forming FET nanosheet stacks, high multilayered fins (such as M1 and M2) are formed, and it is difficult to fill the empty space in the deeper position with the desired material(s), such as filling the empty space near the bottom of the multilayered fins with the material(s) of the gate electrode. This would cause significant difference of the electrical performances between the nanosheet transistors in each of the semiconductor stacks after formation of the gate electrode GE. Specifically, during deposition of the gate electrode GE, the GE material layer (such as a metal filling layer, or a combination of work function tuning layers and the metal layer) surrounding the lowermost channel layer would be much thinner than that surrounding the other channel layers, even incompletely surrounding the lowermost channel layer. The thinner the GE material layer, the larger the threshold voltages of the nanosheet transistor. Therefore, the thinner GE material layer surrounding the lowermost channel layer causes a higher threshold voltage of the lowermost nanosheet transistor, thereby inducing significant difference of the threshold voltages between the nanosheet transistors in each of the semiconductor stacks. According to some embodiments of the present disclosure, at least the space around the lowermost channel layer is enlarged to solve the difficulty of depositing the GE material layer (such as the metal layer, or a combination of the work function tuning layer and the metal layer) surrounding the lowermost channel layer. Accordingly, the difference of the electrical performances between the nanosheet transistors in each of the semiconductor stacks can be significantly reduced. For example, more uniform threshold voltages of the nanosheet transistors including the channel layers 12-1, 12-2 and 12-3 in each semiconductor stack can be obtained, in accordance with some embodiments.

Figure 11A:
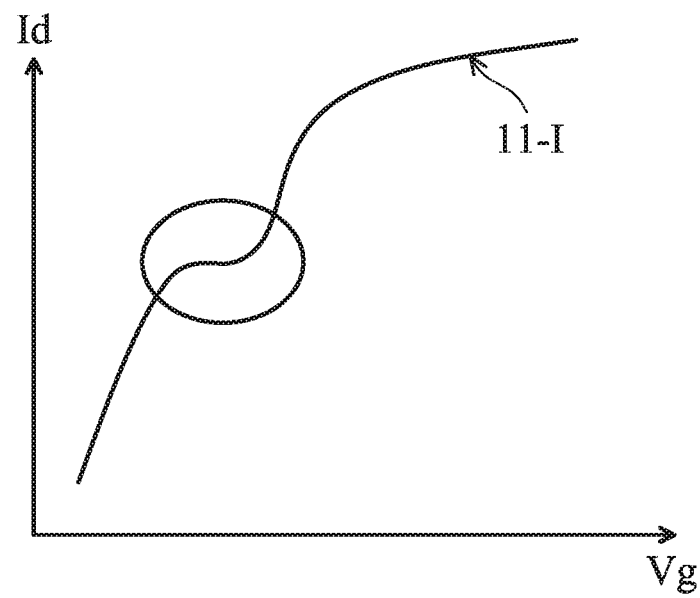
FIG. 11A schematically illustrates I-V (drain current vs. gate voltage) characteristics of a semiconductor stack including nanosheet transistors having non-uniform threshold voltages.
Figure 11B:
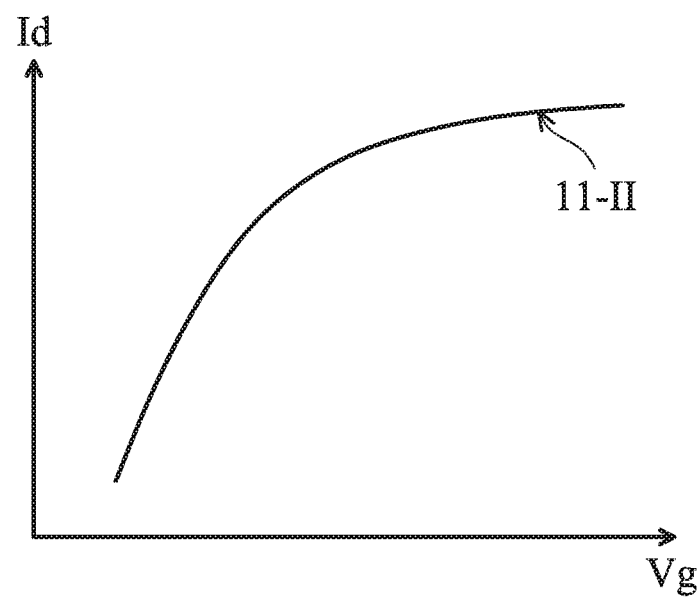
FIG. 11B schematically illustrates I-V (drain current vs. gate voltage) characteristics of a semiconductor stack including nanosheet transistors having uniform threshold voltages, in accordance with some embodiments.

FIG. 11A schematically illustrates I-V (drain current vs. gate voltage) characteristics of a semiconductor stack including nanosheet transistors having non-uniform threshold voltages. The circled region on the I-V curve 11-I in FIG. 11A may be caused by the higher threshold voltage of the lowermost nanosheet transistor in the semiconductor stack. For example, the first nanosheet transistor (including the lowermost channel layer in a semiconductor stack) has a threshold voltage of about 25V and the other nanosheet transistors (including the other channel layers) have threshold voltages of about 20. When the voltage applied to the gate electrode is increased, a flat section is shown in the middle of the I-V curve 11-I, such as the circled flat section in FIG. 11A. FIG. 11B schematically illustrates I-V (drain current vs. gate voltage) characteristics of a semiconductor stack including nanosheet transistors having uniform threshold voltages, in accordance with some embodiments. Compared with the I-V curve 11-I as shown in FIG. 11A, the drain current of the I-V curve 11-II shown in FIG. 11B increases gradually and smoothly with the increase of the voltage applied to the gate electrode, and no flat section shown in the middle of the I-V curve 11-II.

In addition, as shown in FIG. 9B and FIG. 10, in some embodiments, the first space SP1 (in the third direction D3) between the two lowermost channel layers (such as the channel layers 12-1 and 12-2) is greater than the second space SP2 (SP1>SP2) between the two uppermost channel layers (such as the channel layers 12-2 and 12-3), thereby reducing the threshold voltage difference between the nanosheet transistors including the channel layers in each semiconductor stack ($M1_G$ or $M2_G$). Thus, more uniform threshold voltages of the nanosheet transistors including the channel layers 12-1, 12-2 and 12-3 in each semiconductor stack ($M1_G$ or $M2_G$) can be obtained, in accordance with some embodiments. In some embodiments, the difference between the first space SP1 and the second space SP2 is greater than 5 nm. In some embodiments, the difference between the first space SP1 and the second space SP2 is within a range of about 5 nm to about 30 nm.

Besides altering the spaces between adjacent channel layers in each semiconductor stack as described in the above embodiments, the compositions of the channel layers in each of the semiconductor stacks ($M1_G$ or $M2_G$) can be changed to improve the electrical performances of the nanosheet transistors in the semiconductor stack.

Figure 12:
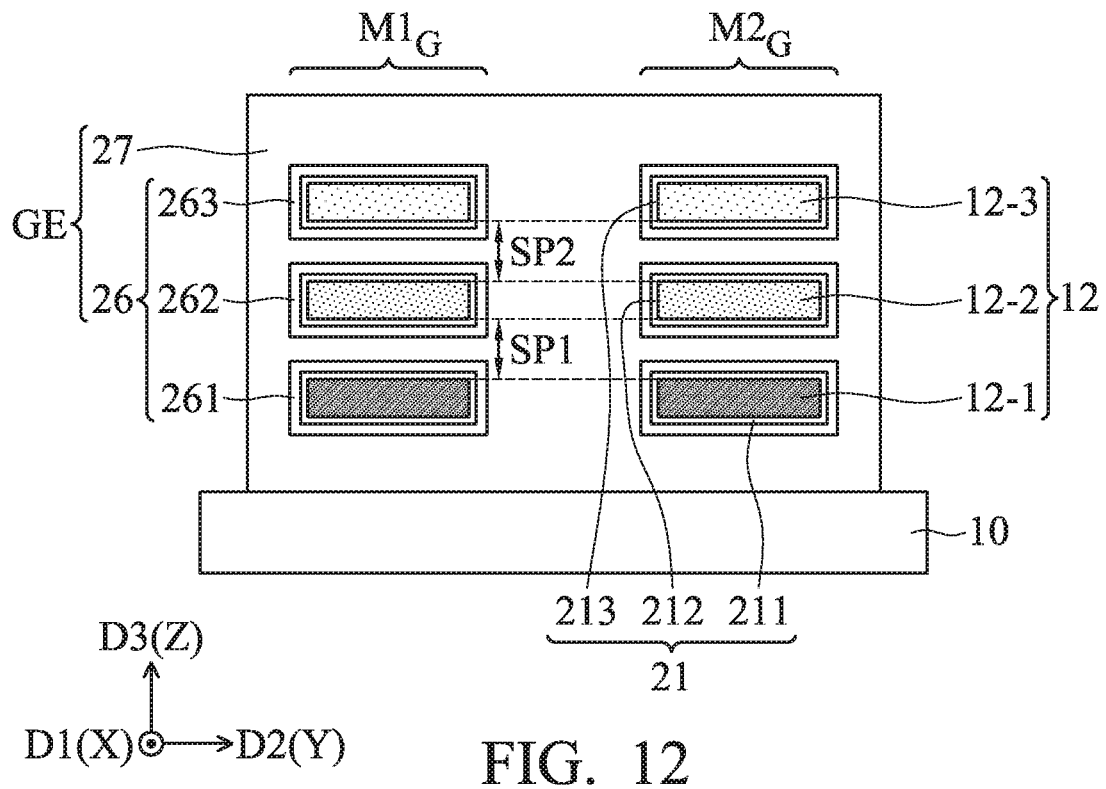
FIG. 12 is a cross-sectional view of a semiconductor structure in accordance with some embodiments.

FIG. 12 is a cross-sectional view of a semiconductor structure in accordance with some embodiments. Each of the multilayered fins M1 and M2 (extending in the first direction D1) includes several channel layers alternating over the substrate 10. Also, the gate dielectric layers 21 surround the respective channel layers 12, and a gate electrodes GE extends in the second direction D2 and across the multilayered fins M1 and M2 to form the semiconductor stacks $M1_G$ and $M2_G$. In one example, as shown in FIG. 12, the first channel layer 12-1, the second channel layer 12-2 and the third channel layer 12-3 are alternately arranged over the substrate 10, and the gate dielectric layers 211, 212 and 213 surround the first channel layer 12-1, the second channel layer 12-2 and the third channel layer 12-3, respectively. Also, the work function tuning layers 261, 262 and 263 of the gate electrodes GE surround the respective gate dielectric layers 211, 212 and 213, and the metal filling layer 27 fills between the work function tuning layers 261, 262 and 263.

The same or similar reference numerals or reference designators denote the same or similar elements in FIG. 10 and FIG. 12. It is noted that structures and material(s) of the elements in FIG. 12 are similar to those in FIG. 10 for the previously described embodiment, so that the details of the elements will not be redundantly repeated herein. In addition, a method for forming the semiconductor structure in FIG. 12 is similar to those for the previously described embodiment, and the details will not be repeated herein.

In some embodiments, the channel layers 12 in one of the semiconductor stacks $M1_G$ and $M2_G$ as shown in FIGS. 9A, 9B and 10 are made of the same material or compound including elements with identical molar ratios, wherein the spaces between adjacent channel layers in each semiconductor stack are changed (e.g. SP1>SP2) to improve the electrical performances of the nanosheet transistors in the semiconductor stack. However, the disclosure is not limited thereto. The electrical performances of the nanosheet transistors can be improved by modifying the compositions of the channel layers in each semiconductor stack without changing the spaces between adjacent channel layers.

In some embodiments, as shown in FIG. 12, the spaces between adjacent channel layers 12 in each semiconductor stack are the same (e.g. SP1=SP2). The channel layers 12 in one of the semiconductor stacks $M1_G$ and $M2_G$ may include a compound formed by at least two elements with different molar ratio. In some embodiments, the channel layers 12 include a compound formed by at least two elements selected from group IV semiconductor materials, such as Si, Ge, SiGe, or a compound including Sn or Pb. In some embodiments, the channel layers 12 includes compound formed by elements selected from group III-V semiconductor materials, such as GaAs, InAs or InSb. It should be noted that the channel layer 12 of the present disclosure is not limited the aforementioned materials.

In some embodiments, the lowermost channel layer (such as channel layer 12-1) in one of the semiconductor stacks $M1_G$ and $M2_G$ has a higher germanium content than any of the other channel layers (such as channel layers 12-2 and 12-3) in the semiconductor stack. In some embodiments, the lowermost channel layer (such as channel layer 12-1) comprises no more than 0.7 molar ratio of germanium. In some other embodiments, the germanium content of the channel layers 12 decreases as the distance (also referred as the vertical distance) in the third direction D3 (e.g. the Z-direction) between the channel layers 12 and the substrate 10 increases.

In addition, in some embodiments, the channel layers 12 are made of silicon germanium, and the molar ratios of silicon and germanium in each of the channel layers 12 are different. For example, the channel layers 12-1, 12-2 and 12-3 in one of the semiconductor stacks $M1_G$ and $M2_G$ are respectively made of $Si_{(1-z)}Ge_z$, $Si_{(1-y)}Ge_y$, $Si_{(1-x)}Ge_x$, wherein Z>Y>X. In some embodiments, Z is greater than Y and less than 0.7 (0.7>Z>Y), Y is greater than 0 and less than Z (Z>Y>0), and X is greater than 0 (Y>X>0). In some embodiments, the difference between Z and Y is within a range of about 0.05 to about 0.5, and the difference between Y and X is within a range of about 0.05 to about 0.5. According to some embodiments of the present disclosure, the higher the germanium content of the channel layer, the lower the threshold voltage of the nanosheet transistor.

Thus, according to some embodiments described above, the lowermost channel layer (such as the channel layer 12-1) in one of the semiconductor stacks has a higher germanium content than any of the other channel layers (such as channel layer 12-2 and 12-3). Since it is difficult to fill the empty space near the bottom of the multilayered fins and the lowermost channel layer would be surrounded by a thinner GE material layer (which induces a higher threshold voltage) as discussed above, the defects of threshold voltage difference between the nanosheet transistors in the semiconductor stack (such as $M1_G$ or $M2_G$) can be compensated for by increasing the germanium content of the lowermost channel layer (such as the molar ratios of germanium to silicon in a SiGe channel layer) to decrease the threshold voltage, in accordance with some embodiments. Thus, more uniform threshold voltages of the nanosheet transistors including the channel layers 12-1, 12-2 and 12-3 in one of the semiconductor stacks (such as M1$_G$ and M2$_G$) can be obtained.

In addition, the electrical performances of the nanosheet transistors in a semiconductor stack can be improved (e.g. uniform threshold voltages of the nanosheet transistors) by altering the spaces between adjacent channel layers in the semiconductor stack and changing the compositions of the channel layers in the semiconductor stack, in accordance with some embodiments of the present disclosure.

Figure 13:
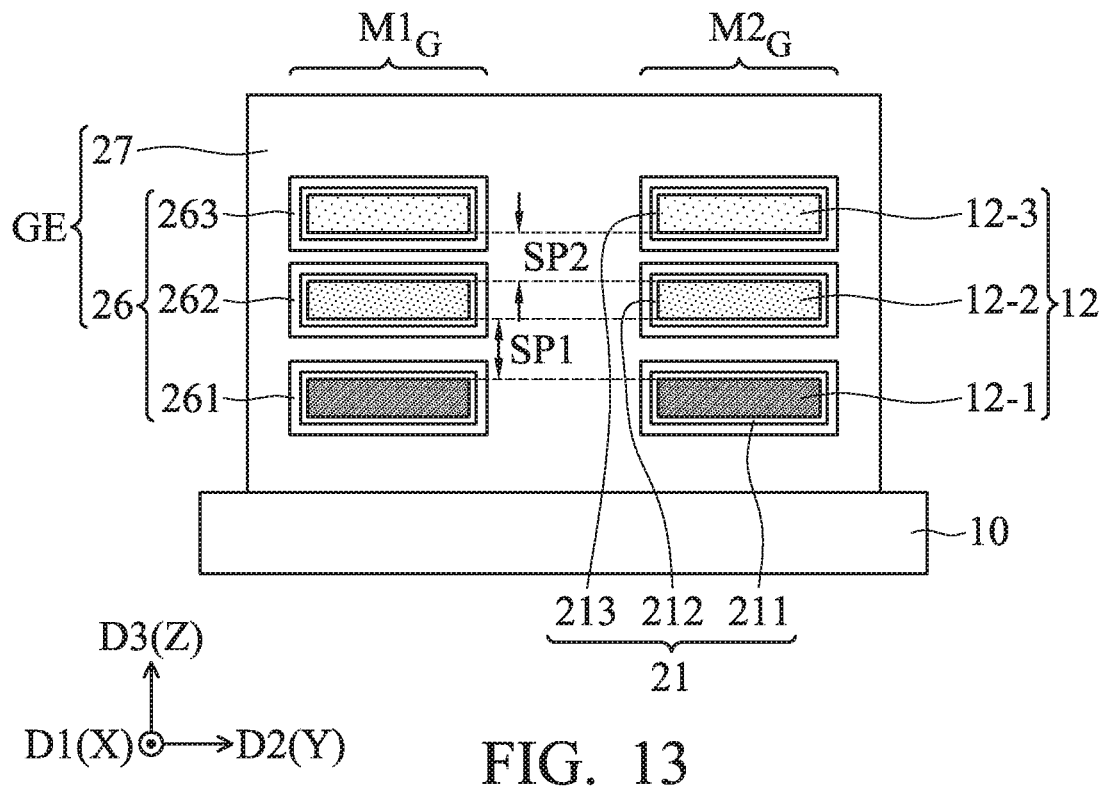
FIG. 13 is a cross-sectional view of a semiconductor structure in accordance with some embodiments.

FIG. 13 is a cross-sectional view of a semiconductor structure in accordance with some embodiments of the present disclosure. In some embodiments, the lowermost channel layer in one of the semiconductor stacks (such as M1$_G$ and M2$_G$) includes a higher germanium content than the other channel layers in the semiconductor stack, and the spaces between adjacent channel layers in one of the semiconductor stacks (such as M1$_G$ and M2$_G$) are also changed to enlarge the space around the lowermost channel layer. For example, the space (in the third direction D3) between the two lowermost channel layers is greater than the space between the two uppermost channel layers.

As shown in FIG. 13, the channel layers 12-1, 12-2 and 12-3 in one of the semiconductor stacks M1$_G$ and M2$_G$ are respectively formed by $Si_{(1-z)}Ge_z$, $Si_{(1-y)}Ge_y$, $Si_{(1-x)}Ge_x$, wherein Z>Y>X. Also, the first space SP1 in the third direction D3 between the first channel layers 12-1 and the second channel layer 12-2 (i.e. the two lowermost channel layers) is greater than the second space SP2 (SP1>SP2) in the third direction D3 between the second channel layer 12-2 and the third channel layer 12-3 (i.e. the two uppermost channel layers). Thus, uniform threshold voltages of the nanosheet transistors including the channel layers 12-1, 12-2 and 12-3 in each semiconductor stack can be obtained, in accordance with some embodiments of the present disclosure.

After the structures as shown in FIG. 12 and FIG. 13 are formed, the subsequent processes are performed to complete a FET structure including nanosheet transistors. For example, the source/drain features (not shown) are formed to contact the channel layers 12 of the semiconductor stacks M1$_G$ and M2$_G$, followed by forming source/drain contacts and gate contacts, in accordance with some embodiments of the present disclosure. Details of the subsequent processes for forming the FET structure including nanosheet transistors are not described herein.

It should be noted that the details of the structures of the embodiments are provided for exemplification, and the described details of the embodiments are not intended to limit the present disclosure. It should be noted that not all embodiments of the invention are shown. Modifications and variations can be made without departing from the spirit of the disclosure to meet the requirements of the practical applications. Thus, there may be other embodiments of the present disclosure which are not specifically illustrated. Furthermore, the accompanying drawings are simplified for clear illustrations of the embodiment. Sizes and proportions in the drawings may not be directly proportional to actual products. Thus, the specification and the drawings are to be regard as an illustrative sense rather than a restrictive sense.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
semiconductor stacks over a substrate, wherein each of the semiconductor stacks extends in a first direction, and adjacent semiconductor stacks are spaced apart from each other in a second direction, which is different from the first direction, wherein each of the semiconductor stacks comprises:
channel layers above the substrate and spaced apart from each other in a third direction, wherein the third direction is vertical to the first direction and the second direction; and
a gate structure, comprising:
gate dielectric layers around the respective channel layers; and
a gate electrode along sidewalls of the gate dielectric layers and a top surface of an uppermost gate dielectric layer of the gate dielectric layers, wherein the gate electrode comprises:
work function tuning layers that surround the gate dielectric layers; and
a metal filling layer around the work function tuning layers,
wherein first spaces between the work function tuning layers around the upper channel layers in one of the semiconductor stacks are fully filled with the metal filling layer, and second spaces between the work function tuning layers around the lower channel layers in the semiconductor stacks are not fully filled with the metal filling layer,
wherein a space in the third direction between two lowermost channel layers of the channel layers is greater than a space in the third direction between two uppermost channel layers of the channel layers.

2. The semiconductor structure as claimed in claim 1, wherein the space in the third direction between the two lowermost channel layers is defined as a first space, the space in the third direction between the two uppermost channel layers is defined as a second space, and a difference between the first space and the second space is within a range of 5 nm to 30 nm.

3. The semiconductor structure as claimed in claim 1, wherein the space between the two uppermost channel layers in one of the semiconductor stacks is filled with two of the gate dielectric layers and two of the work function tuning layers.

4. The semiconductor structure as claimed in claim 1, wherein the channel layers in one of the semiconductor stacks are formed of a same material, or a same compound with the same molar ratio of two or more elements.

5. The semiconductor structure as claimed in claim 1, wherein the channel layers in one of the semiconductor stacks are formed of a same compound with different molar ratios of two or more elements.

6. The semiconductor structure as claimed in claim 1, wherein the channel layers in one of the semiconductor stacks comprise silicon germanium and a lowermost channel layer of the channel layers includes a higher germanium content than a germanium content of the other channel layers in said semiconductor stack.

7. The semiconductor structure as claimed in claim 1, wherein the channel layers comprise one or more elements from group IV semiconductor materials.

8. The semiconductor structure as claimed in claim 1, wherein the channel layers comprise one of group III-V semiconductor materials.

9. The semiconductor structure as claimed in claim 1, wherein the channel layers comprise:
a first channel layer above the substrate;
a second channel layer above the first channel layer, wherein a distance in the third direction between the first channel layer and the second channel layer is defined as a first space; and
a third channel layer above the second channel layer, wherein a distance in the third direction between the second channel layer and the third channel layer is defined as a second space,
wherein the first space is greater than the second space.

10. The semiconductor structure as claimed in claim 9, wherein a difference between the first space and the second space is greater than 5 nm.

11. The semiconductor structure as claimed in claim 9, wherein the first channel layer, the second channel layer and the third channel layer are formed of silicon or a silicon-containing material with identical molar ratios of elements.

12. The semiconductor structure as claimed in claim 9, wherein the first channel layer, the second channel layer and the third channel layer comprise materials respectively represented as $Si_{(1-Z)}Ge_Z$, $Si_{(1-Y)}Ge_Y$, $Si_{(1-X)}Ge_X$, wherein Z is greater than Y and less than 0.7, Y is greater than 0 and greater than X, and X is greater than 0.

13. The semiconductor structure as claimed in claim 12, wherein a difference between Z and Y is within a range of about 0.05 to about 0.5, and a difference between Y and X is within a range of about 0.05 to about 0.5.

14. The semiconductor structure as claimed in claim 1, wherein the gate dielectric layers comprise a high-k dielectric material with a greater dielectric constant than that of silicon dioxide.

15. A semiconductor structure, comprising:
semiconductor stacks over a substrate, wherein each of the semiconductor stacks extends in a first direction, and adjacent semiconductor stacks are spaced apart from each other in a second direction that is different from the first direction, wherein each of the semiconductor stacks comprises:
channel layers above the substrate and spaced apart from each other in a third direction, wherein the third direction is vertical to the first direction and the second direction; and
a gate structure, comprising:
gate dielectric layers around respective channel layers; and
a gate electrode along sidewalls of the gate dielectric layers and a top surface of an uppermost gate dielectric layer of the gate dielectric layers, wherein the gate electrode comprises:
work function tuning layers that surround the gate dielectric layers; and
a metal filling layer around the work function tuning layers,
wherein first spaces between the work function tuning layers around the upper channel layers in one of the semiconductor stacks are fully filled with the metal filling layer, and second spaces between the work function tuning layers around the lower channel layers in the semiconductor stacks are not fully filled with the metal filling layer,
wherein a lowermost channel layer of the channel layers in a first semiconductor stack of the semiconductor stacks includes a higher germanium content than a germanium content of the other respective channel layers in said first semiconductor stack.

16. The semiconductor structure as claimed in claim 15, wherein the germanium content of the channel layers decreases as a distance between the channel layers and the substrate increases in the third direction.

17. The semiconductor structure as claimed in claim 15, wherein the channel layers are formed of compounds comprising germanium and an element from group IV semiconductor materials.

18. The semiconductor structure as claimed in claim 15, wherein a space in the third direction between the two lowermost channel layers is greater than a space between the two uppermost channel layers.

19. The semiconductor structure as claimed in claim 15, wherein a space between two uppermost channel layers in one of the semiconductor stacks is filled with two of the gate dielectric layers and two of the work function tuning layers.

20. The semiconductor structure as claimed in claim 15, wherein the gate dielectric layers comprise a high-k dielectric material with a greater dielectric constant than that of silicon dioxide.

21. The semiconductor structure as claimed in claim 15, wherein the channel layers comprise:
a first channel layer above the substrate, and the first channel layer comprises $Si_{(1-Z)}Ge_Z$;
a second channel layer above the first channel layer, and the second channel layer comprises $Si_{(1-Y)}Ge_Y$; and
a third channel layer above the second channel layer, and the third channel layer comprises $Si_{(1-X)}Ge_X$,
wherein Z is greater than Y and less than 0.7, Y is greater than X and greater than 0, and X is greater than 0.

22. The semiconductor structure as claimed in claim 21, wherein a difference between Z and Y is within a range of about 0.05 to about 0.5, and a difference between Y and X is within a range of about 0.05 to about 0.5.

23. The semiconductor structure as claimed in claim 21, wherein a distance in the third direction between the first channel layer and the second channel layer is defined as a first space, and a distance in the third direction between the second channel layer and the third channel layer is defined as a second space, wherein the first space is greater than the second space.

* * * * *